(12) United States Patent
Maier et al.

(10) Patent No.: US 9,059,182 B2
(45) Date of Patent: Jun. 16, 2015

(54) METHOD FOR PRODUCING BONDING CONNECTION OF SEMICONDUCTOR DEVICE

(75) Inventors: Hubert Maier, Villach (AT); Thomas Detzel, Villach (AT)

(73) Assignee: Infineon Technologies AG, Munich (DE)

( * ) Notice: Subject to any disclaimer, the term of this patent is extended or adjusted under 35 U.S.C. 154(b) by 2570 days.

(21) Appl. No.: 11/521,087

(22) Filed: Sep. 14, 2006

(65) Prior Publication Data
US 2007/0063318 A1 Mar. 22, 2007

(30) Foreign Application Priority Data
Sep. 14, 2005 (DE) .......................... 10 2005 043 914

(51) Int. Cl.
*H01L 21/44* (2006.01)
*H01L 23/544* (2006.01)
*H01L 23/00* (2006.01)
*H01L 23/58* (2006.01)
*H01L 23/48* (2006.01)
*H01L 23/52* (2006.01)
*H01L 29/40* (2006.01)

(52) U.S. Cl.
CPC .............. *H01L 23/544* (2013.01); *H01L 24/05* (2013.01); *H01L 24/48* (2013.01); *H01L 24/85* (2013.01); *H01L 2223/54426* (2013.01); *H01L 2223/54473* (2013.01); *H01L 2223/5448* (2013.01); *H01L 2224/02166* (2013.01); *H01L 2224/04042* (2013.01); *H01L 2224/05556* (2013.01); *H01L 2224/05558* (2013.01); *H01L 2224/05599* (2013.01); *H01L 2224/48091* (2013.01); *H01L 2224/48455* (2013.01); *H01L 2224/4847* (2013.01); *H01L 2224/85121* (2013.01); *H01L 2224/85399* (2013.01); *H01L 2924/01005* (2013.01); *H01L 2924/01014* (2013.01); *H01L 2924/01015* (2013.01); *H01L 2924/00014* (2013.01); *H01L 2924/01033* (2013.01); *H01L 2224/48458* (2013.01); *H01L 2924/13091* (2013.01)

(58) Field of Classification Search
USPC .......................................... 257/784
See application file for complete search history.

(56) References Cited

U.S. PATENT DOCUMENTS

| 4,308,549 A | * | 12/1981 | Yeh ................................ 257/336 |
| 4,495,222 A | * | 1/1985 | Anderson et al. ............. 438/612 |

(Continued)

FOREIGN PATENT DOCUMENTS

| JP | 57152130 A | 9/1982 |
| JP | 05243318 A | 9/1993 |

OTHER PUBLICATIONS

Definition of "local". Oxford Dictionaries. Apr. 2010. Oxford University Press. Dec. 29, 2010 <http://oxforddictionaries.com/view/entry/m_en_us1264028>.*

(Continued)

*Primary Examiner* — Michael Jung
(74) *Attorney, Agent, or Firm* — Maginot, Moore & Beck, LLP

(57) ABSTRACT

An arrangement is employed in a semiconductor device having a semiconductor body, the semiconductor body having a surface. The arrangement includes a surface portion on which a first metallization layer is arranged, and an alignment pattern arranged between the surface portion and the first metallization layer.

11 Claims, 8 Drawing Sheets

(56) References Cited

U.S. PATENT DOCUMENTS

| | | | |
|---|---|---|---|
| 5,407,862 A * | 4/1995 | Miyamoto | 438/653 |
| 5,475,268 A | 12/1995 | Kawagoe et al. | |
| 5,587,336 A * | 12/1996 | Wang et al. | 438/17 |
| 5,767,567 A | 6/1998 | Hu et al. | |
| 6,051,489 A * | 4/2000 | Young et al. | 438/612 |
| 6,191,023 B1 * | 2/2001 | Chen | 438/612 |
| 6,426,556 B1 * | 7/2002 | Lin | 257/738 |
| 6,677,228 B1 * | 1/2004 | Su et al. | 438/612 |
| 6,794,732 B2 * | 9/2004 | Nakatani | 257/643 |
| 8,368,213 B2 * | 2/2013 | Lee et al. | 257/738 |
| 2004/0136123 A1 * | 7/2004 | Nakamura et al. | 361/35 |
| 2006/0049525 A1 * | 3/2006 | Lin et al. | 257/758 |

OTHER PUBLICATIONS

Definition of "elevation". Oxford Dictionaries. Apr. 2010. Oxford University Press. Dec. 29, 2010 <http://oxforddictionaries.com/view/entry/m_en_us1243623>.*

Definition of Alignment. (n.d.) The American Heritage® Dictionary of the English Language, Fourth Edition. (2003). Retrieved May 27, 2014 from http://www.thefreedictionary.com/alignment.*

On. 2014. In Merriam-Webster.com. Retrieved May 27, 2014, from http://www.merriam-webster.com/dictionary/on.*

* cited by examiner

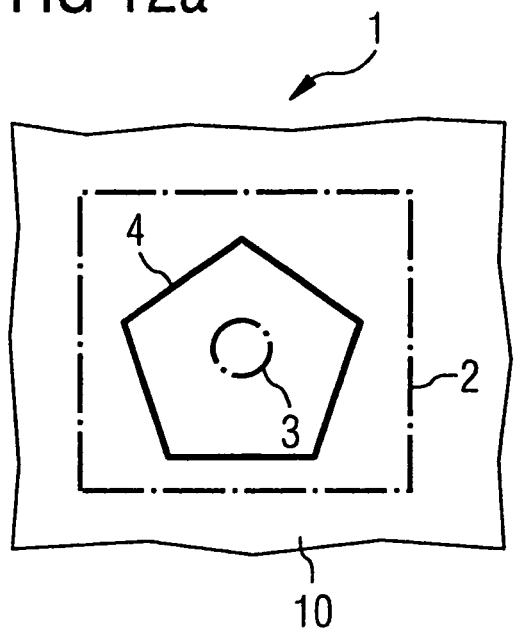
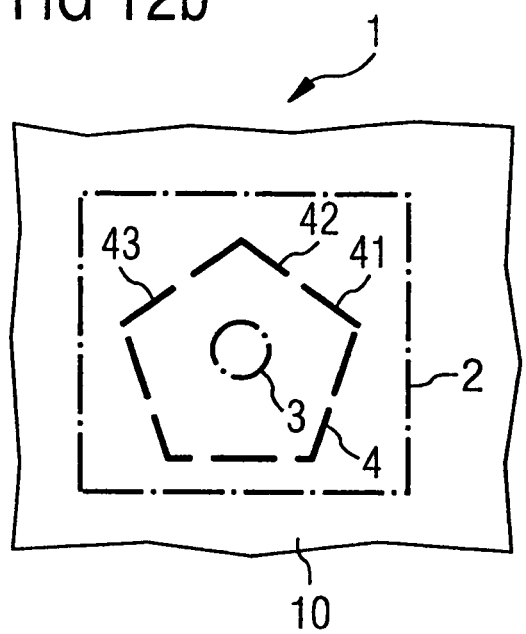
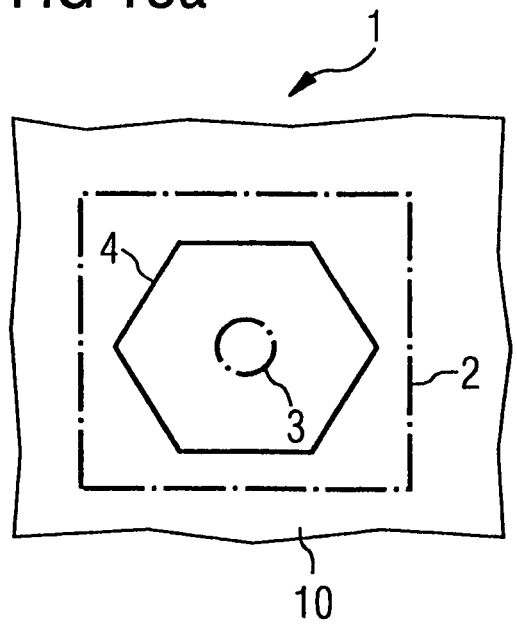
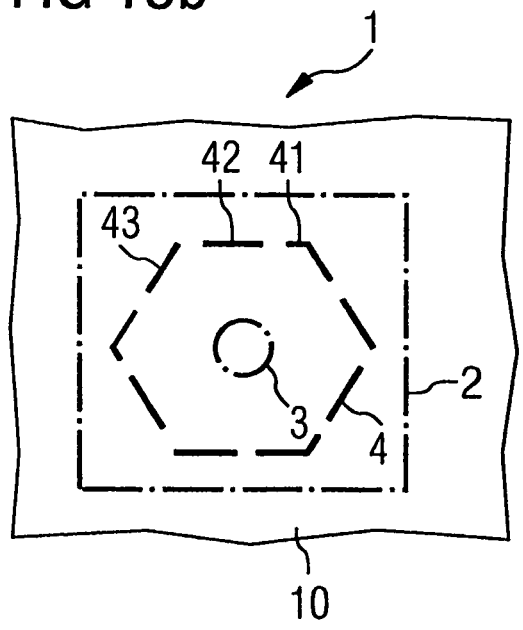

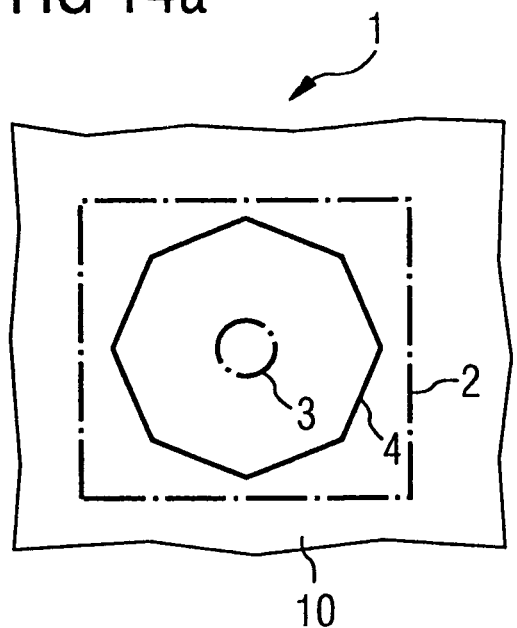
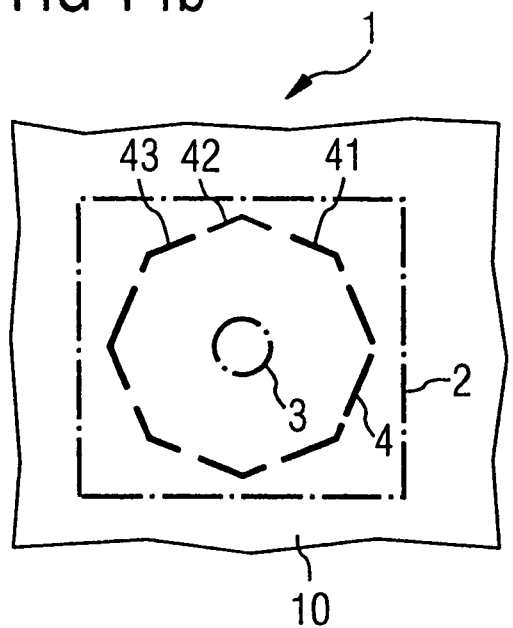
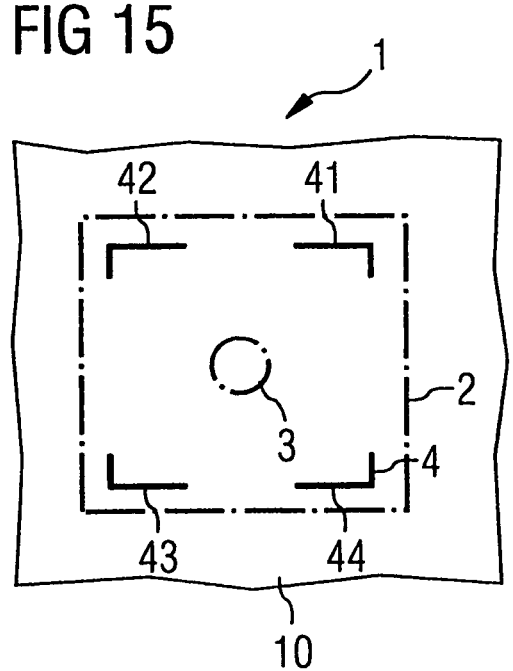

METHOD FOR PRODUCING BONDING CONNECTION OF SEMICONDUCTOR DEVICE

FIELD OF THE INVENTION

The invention relates to a semiconductor device which is to be electrically contacted by means of a bonding connection.

BACKGROUND

Electrical contacting to a semiconductor device can take place by means of a bonding partner, for example a bonding wire. The bonding partner has to be electrically connected to the surface of the semiconductor body of the semiconductor device within a predetermined permissible region.

The connection generally does not take place directly between the surface of the semiconductor body and the bonding partner but with an interposed metallization, such as for example a bonding pad.

In order to avoid defects on the semiconductor device, the bonding partner must be placed specifically in a predetermined bonding position, for example a specific location on a metallization of the semiconductor body, when the bonding connection is produced.

In particular, it is also of interest to determine the precise bonding position on a large-area metallization, in order to avoid greatly differing current densities in the region of the metallization.

Previous power semiconductor devices have usually been provided with an imide and/or nitride passivation, which has a clearance for producing the bonding connection. It has therefore been possible to use the edges of these clearances as a reference for the exact positioning of the bonding partner within the clearance.

Recently, however, such passivation layers have not been provided. This also means that there is no longer the possibility of using the edges of openings in a passivation as a reference for the positioning of a bonding partner.

SUMMARY

At least some embodiments of the present invention provide a semiconductor device in which positioning of the bonding partner with respect to the semiconductor body of a semiconductor device is carried out with improved precision is possible.

A first embodiment is an arrangement that is employed in a semiconductor device having a semiconductor body, the semiconductor body having a surface. The arrangement includes a surface portion on which a first metallization layer is arranged, and an alignment pattern arranged between the surface portion and the first metallization layer.

Another embodiment contemplates the use of a similar arrangement in the location of a bonding position.

Exemplary embodiments of the invention are explained in more detail below on the basis of preferred exemplary embodiments with reference to figures.

BRIEF DESCRIPTION OF THE DRAWINGS

FIG. 12a shows an arrangement in which the alignment pattern is arranged along the periphery of a pentagon, FIG. 12b shows an arrangement according to FIG. 12a in which the alignment pattern is formed by spaced-apart pattern features, FIG. 13a shows an arrangement in which the alignment pattern is arranged along the periphery of a hexagon, FIG. 13b shows an arrangement according to FIG. 13a in which the alignment pattern is formed by spaced-apart pattern features, FIG. 14a shows an arrangement in which the alignment pattern is arranged along the periphery of an octagon, FIG. 14b shows an arrangement according to FIG. 14a in which the alignment pattern is formed by spaced-apart pattern features, and FIG. 15 shows an arrangement with an alignment pattern which is arranged along the periphery of a quadrilateral and comprises four spaced-apart pattern features, each of which is located at a corner of the quadrilateral.

DETAILED DESCRIPTION

Figure 1:
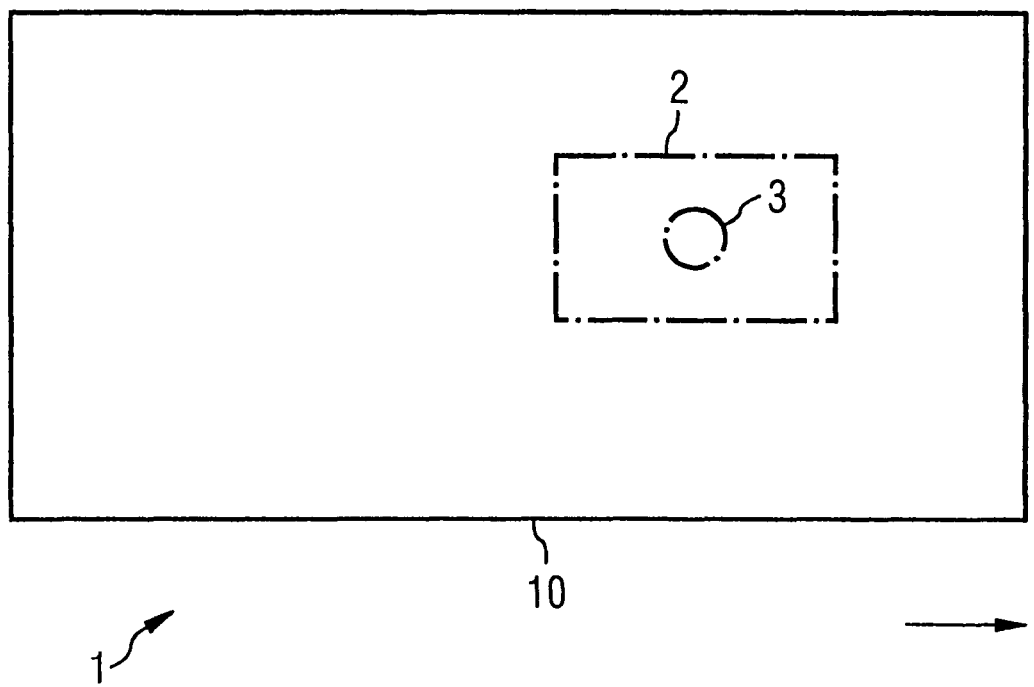
FIG. 1 shows a semiconductor body with an upper metallization layer in plan view.

In the figures, the same reference numerals designate the same parts with the same meaning.

The semiconductor device according to at least some embodiments of the invention comprises a semiconductor body, the surface of which has a surface portion on which at least a first metallization layer is arranged. Furthermore, an alignment pattern is arranged between the surface portion and the first metallization layer.

The alignment pattern located under the first metallization layer has the effect that an elevation is locally created on the upper side of the first metallization layer. The position of the local elevation can be optically determined, for example by means of an image recognition system, with respect to the semiconductor body. With the knowledge of the position of the local elevation, it is then possible to control a bonding tool, which places a bonding partner at an intended bonding position on the first metallization layer and connects it to the latter.

The alignment pattern may be formed from a dielectric, for example an oxide, with particular preference an oxide of the material of the semiconductor body.

The semiconductor device may optionally have one or more further metallization layers, arranged between the first metallization layer and the surface portion. In this case, the alignment pattern may be arranged between metallization layers that are adjacent in the region of the surface portion.

Similarly, however, it is possible for the alignment pattern to be arranged between the surface portion and the metallization layer closest to it. In this case, the alignment pattern may be arranged indirectly or directly on the surface portion.

According to an advantageous embodiment of the invention, the alignment pattern may be formed as part of an intermetal dielectric layer arranged between two metallization layers, so that the alignment pattern can be produced by merely minor adaptation of the intermetal dielectric layer without any additionally required layer deposition or without any additionally required photo process. In this way, the geometry of the alignment pattern can also be adapted in a simple way to the requirements of the bonding machine.

The alignment pattern is preferably arranged along a line. With particular preference, the alignment pattern is arranged along the periphery of a surface area, it being possible for the surface area to be formed in particular as a circle or an ellipse or as a regular or irregular polygon.

Such a polygon is preferably formed as a triangle, as a quadrilateral, as a pentagon, as a hexagon, as an octagon, as a parallelogram or as a rhombus.

The alignment pattern may comprise both a single feature and two or more equidistantly spaced-apart pattern features. Similarly, the pattern features may be apart at different intervals and/or be of different lengths and/or shapes. This provides the possibility of imparting on the alignment pattern a coding which can be evaluated in the evaluation, for example by means of an image recognition system, and can be used for determining the position and the orientation of the alignment pattern with respect to the semiconductor body.

The pattern features are preferably formed in the manner of ridges and have a rectangular cross section. In particular, two or more of the pattern features of an alignment pattern may be identically shaped.

The pattern features have a length of preferably 2 µm to 100 µm, a width of 5 µm to 50 µm and a height of 0.5 µm to 3 µm.

FIG. 1 shows the plan view of a semiconductor body 1, which is provided with a patterned metallization 10. For the electrical contacting of the semiconductor body 1, the uppermost metallization layer 10 in a surface portion 2 of the semiconductor body 1 that is indicated by dashed lines is to be connected to a bonding partner, for example a bonding wire. In this case, a bonding position 3 which is located within the surface portion 2 in the lateral direction r is preferred for producing the bonding connection.

Figure 2:
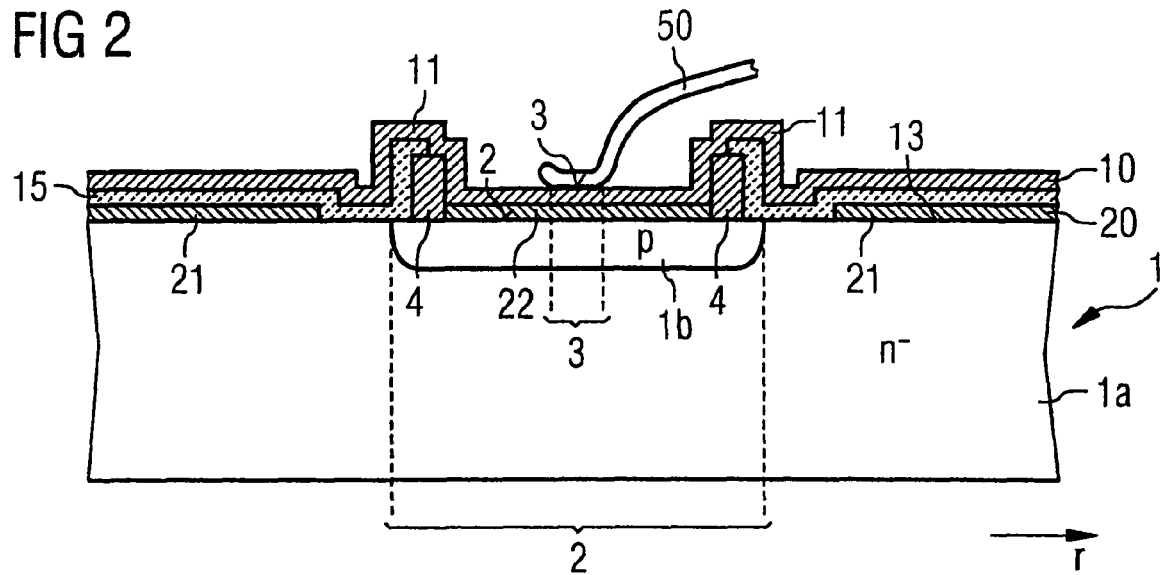
FIG. 2 shows a cross section through a semiconductor body with a p-doped semiconductor zone, which extends to the surface of the semiconductor body, the alignment pattern being arranged in the region of the p-doped semiconductor zone in the lateral direction on the surface of the semiconductor body.

FIG. 2 shows a vertical section through a semiconductor device according to FIG. 1 on which a bonding connection is produced.

The semiconductor body 1 preferably comprises a substrate, for example a semiconductor wafer. Introduced from a front side 13 of the semiconductor body 1 into the semiconductor wafer 1, which has a weak n-type basic doping, is a p-doped semiconductor zone 1b.

Applied to the front side 13 are a first metallization layer 10 and a patterned second metallization layer 20, arranged between the first metallization layer 10 and the front side 13. Arranged between the first metallization layer 10 and the second metallization layer 20 is a patterned dielectric layer 15.

The second metallization layer 20 has portions 21, 22, the portion 22 electrically contacting the p-doped semiconductor zone 1b.

For the external electrical contacting of the p-doped semiconductor zone 1b, a bonding wire 50 in the region of a surface portion 2 of the semiconductor body 1 is connected at a preferred bonding position 3 to the uppermost metallization layer 10 in the region of the surface portion 2.

In order to be able to determine the preferred bonding position 3, applied directly to the front side 13, within the surface region 2 in the lateral direction r, is an alignment pattern 4.

As an alternative to this, the alignment pattern 4 may also be arranged indirectly on the front side 13, above a metallization layer and/or a dielectric layer.

The alignment pattern 4 influences the topography of the uppermost metallization layer 10 in the region of the surface portion 2, lying on it, so that the metallization layer 10 has local elevations 11 in the region of the surface portion 2.

The position of these local elevations 11 with respect to the semiconductor body 1 can be determined by optical means, for example by means of an image recognition system coupled to the bonding machine, and used for determining the preferred bonding position 3.

The alignment pattern 4 may in principle be formed from any desired materials, for example a metal, but preferably from a dielectric. The alignment pattern 4 preferably has a rectangular cross section.

Figure 3:
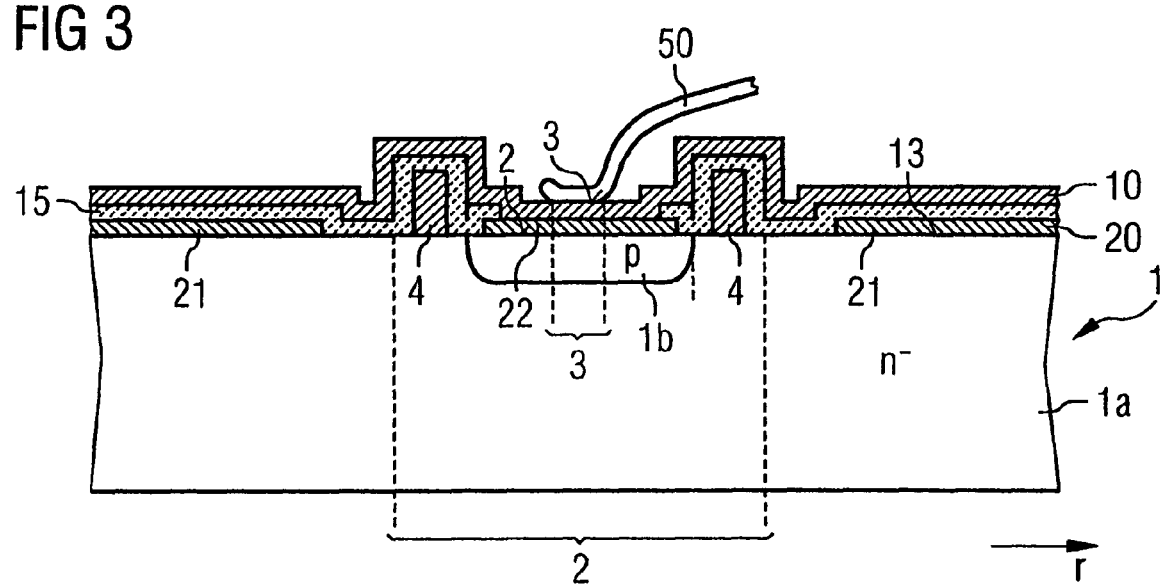
FIG. 3 shows an arrangement according to FIG. 2 in which the alignment pattern is arranged outside the p-doped semiconductor zone in the lateral direction on the surface of the semiconductor body.

While the alignment pattern 4 in the case of the exemplary embodiment according to FIG. 2 is arranged in the region of the p-doped semiconductor zone 1b in the lateral direction r, the alignment pattern 4 in the case of the exemplary embodiment according to FIG. 3 is located outside the p-doped semiconductor zone 1b in the lateral direction r.

Figure 4:
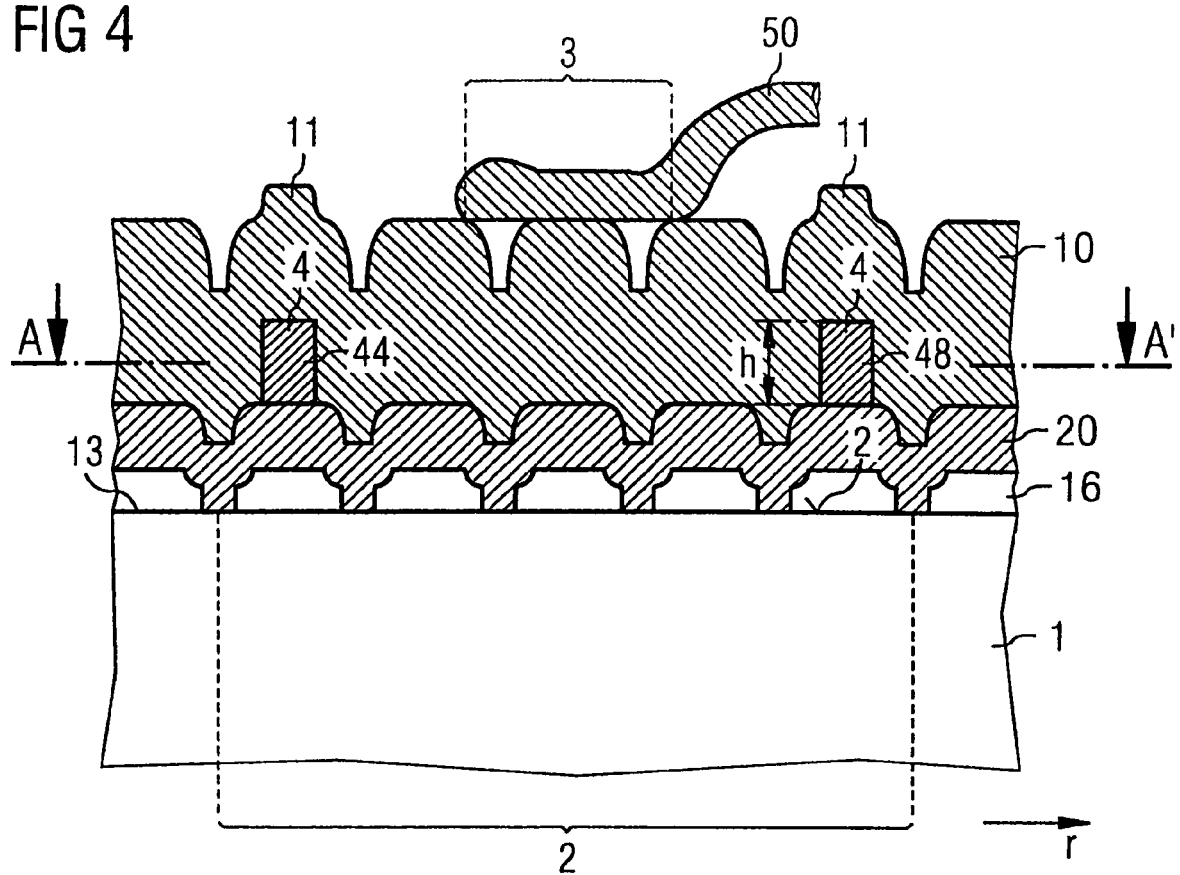
FIG. 4 shows a cross section through a DMOS semiconductor device with an alignment pattern arranged between two metallization layers.

FIG. 4 shows a vertical section through an integrated power circuit with a monolithically integrated logic with a number of DMOS transistor cells (not represented).

Arranged in succession on the front side 13 of the semiconductor body 1 are a patterned dielectric layer 16, a second metallization layer 20 and a first, uppermost metallization layer 10.

For contacting the DMOS transistor cells, portions of the second metallization layer 20 extend through openings in the patterned semiconductor layer 16 up to the front side 13 of the semiconductor body 1. In the lateral direction r, a preferred bonding position 3, at which a bonding wire 50 is connected to the uppermost metallization layer 10, is located within a surface portion 2 of the semiconductor body 1. It should be noted that no passivation layer is applied to the uppermost metallization layer 10.

In order to obtain lowest possible on-state resistance of the device, the bonding position 3 is chosen such that a current distribution that is as even as possible is achieved in the metallization layer 10 and 20.

For the exact positioning of the bonding wire 50 at the preferred bonding position 3, an alignment pattern 4 of oxide, preferably silicon oxide, is provided, arranged between the first, uppermost metallization layer 10 and the surface portion 2 and also between the first, upper-most metallization layer 10 and the second metallization layer 20. The alignment pattern 4 is formed by portions of a patterned intermetal dielectric, of which the portions 44 and 48 can be seen in the present view and which have a height h of preferably 0.5 µm to 3 µm.

Above the portions 44, 48 of the alignment pattern 4, the uppermost metallization layer 10 in the region of the surface portion 2 has local elevations 11. In the production of the bonding connection it was possible to determine the position of the local elevations 11 with respect to the semiconductor body 1 by means of an image recognition system and, dependent on this, to determine the position of the preferred bonding position 3 on the uppermost metallization layer 10.

Figure 5:
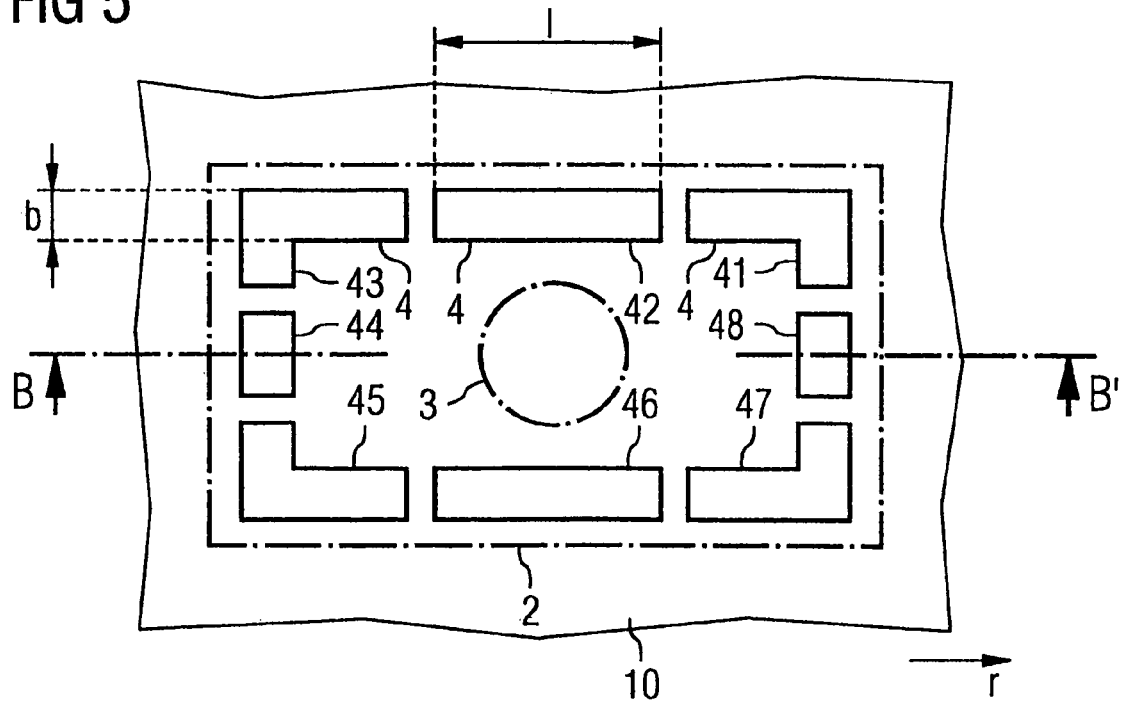
FIG. 5 shows a cross section, extending parallel to the surface of the semiconductor body, through the arrangement according to FIG. 4, through the alignment pattern and through the upper-most metallization level.

FIG. 5 shows a cross section through the arrangement according to FIG. 4 through a plane A-A' represented in FIG. 4, through the uppermost metallization layer 10 and the alignment pattern 4.

Conversely, FIG. 4 shows a vertical section through the arrangement according to FIG. 5 in a sectional plane B-B'.

In FIG. 5 it can be seen that the alignment pattern 4 is formed by equidistantly spaced-apart pattern features 41 to 48.

The pattern features 41 to 48 are formed as straight ridges 42, 44, 46, 48 or as angled ridges 41, 43, 45, 47 and extend along the periphery of a rectangle, within the lateral dimensions of which the preferred bonding position 3 is located.

The pattern features 41-48 respectively have a length l of preferably 2 µm to 100 µm and a width b of preferably 5 µm to 50 µm.

Figure 6A:
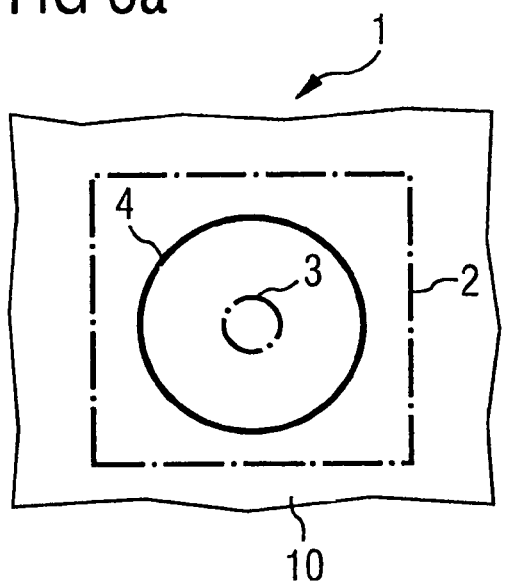
FIG. 6a shows a cross section through a semiconductor device corresponding to the cross section according to FIG. 5 in which the alignment pattern is arranged along the periphery of a circle.
Figure 7A:
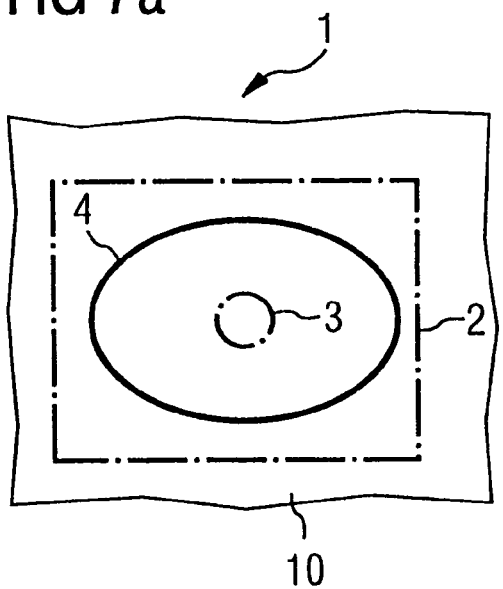
FIG. 7a shows an arrangement in which the alignment pattern is arranged along the periphery of an ellipse.

FIGS. 6a, 7a, ..., 14a show various surface areas along the periphery of which an alignment pattern 4 is respectively arranged.

Figure 8A:
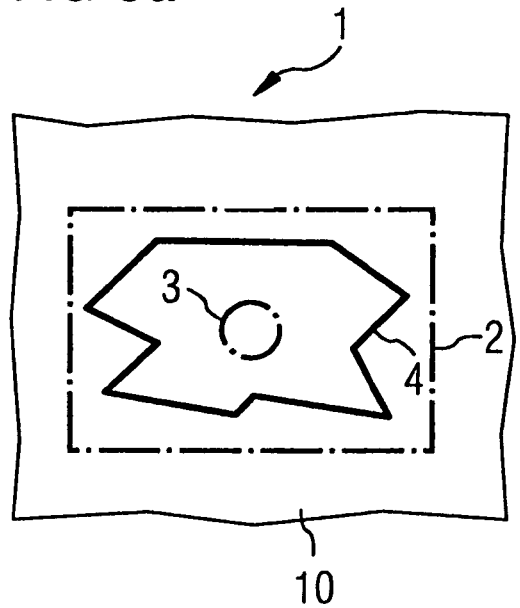
FIG. 8a shows an arrangement in which the alignment pattern is arranged along the periphery of a polygon.
Figure 8B:
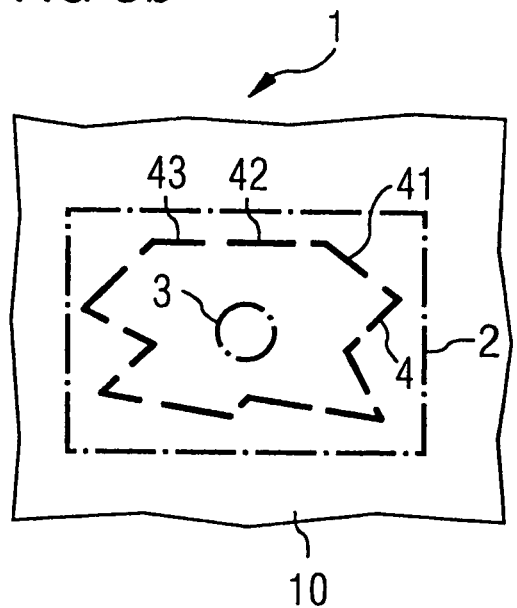
FIG. 8b shows an arrangement according to FIG. 8a in which the alignment pattern is formed by spaced-apart pattern features.
Figure 9A:
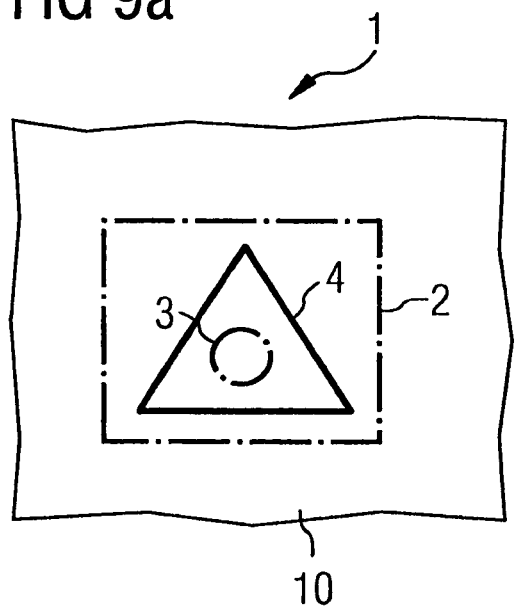
FIG. 9a shows an arrangement in which the alignment pattern is arranged along the periphery of an equilateral triangle.
Figure 9B:
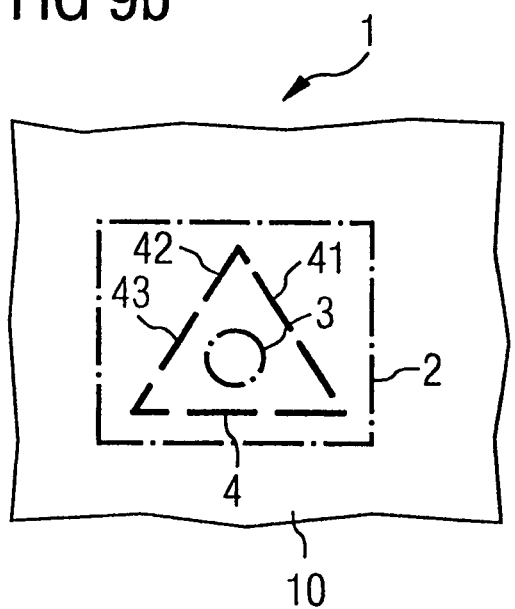
FIG. 9b shows an arrangement according to FIG. 9a in which the alignment pattern is formed by spaced-apart pattern features.
Figure 10A:
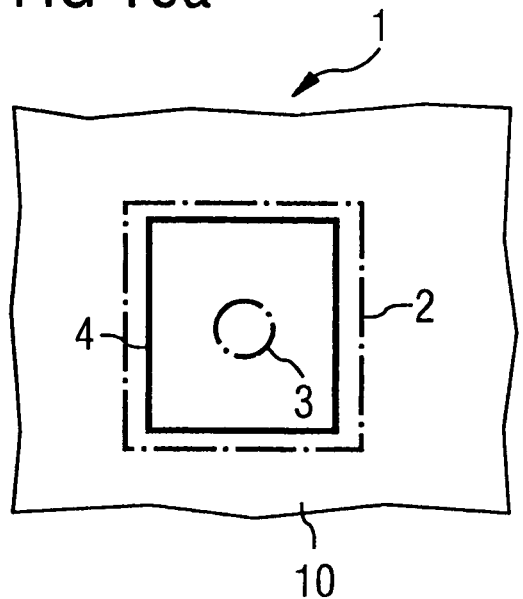
FIG. 10a shows an arrangement in which the alignment pattern is arranged along the periphery of a rectangle.
Figure 10B:
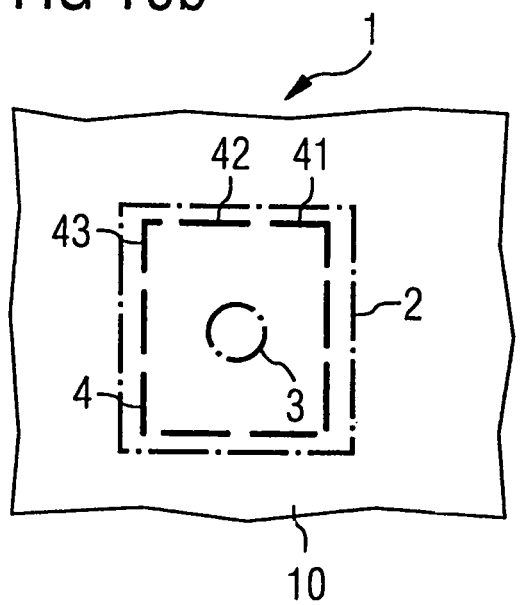
FIG. 10b shows an arrangement according to FIG. 10a in which the alignment pattern is formed by spaced-apart pattern features.
Figure 11A:
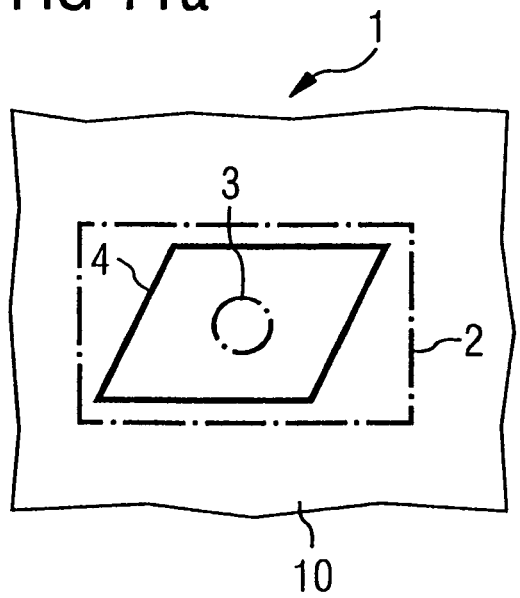
FIG. 11a shows an arrangement in which the alignment pattern is arranged along the periphery of a rhombus.
Figure 11B:
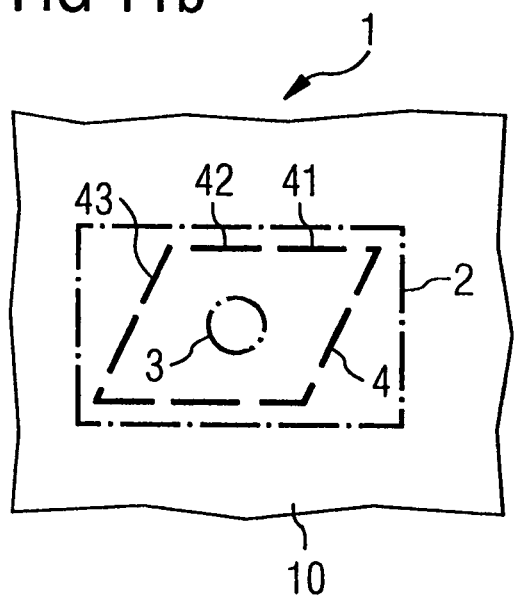
FIG. 11b shows an arrangement according to FIG. 11a in which the alignment structure is formed by spaced-apart pattern features.

According to some embodiments of the invention, the surface areas are formed as a circle (FIG. 6a), as an ellipse (FIG. 7a), as a polygon (FIG. 8a), as a regular or irregular triangle (FIG. 9a), as a rectangle or square (FIG. 10a), as a rhombus (FIG. 11a), as a regular or irregular pentagon (FIG. 12a), as a regular or irregular hexagon (FIG. 13a) or as a regular or irregular octagon (FIG. 14a).

Figure 6B:
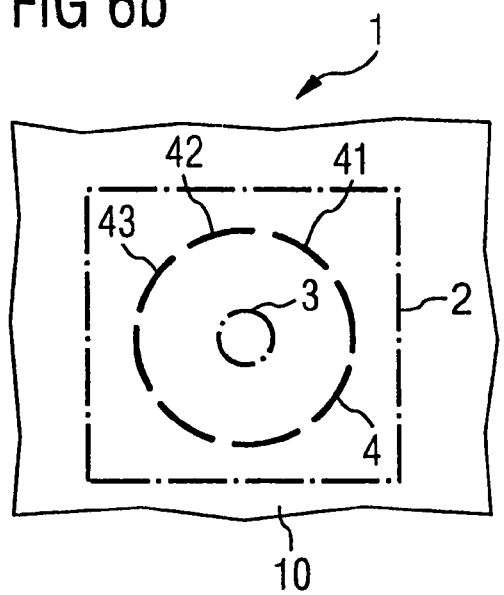
FIG. 6b shows an arrangement according to FIG. 6a in which the alignment pattern is formed by spaced-apart pattern features.
Figure 7B:
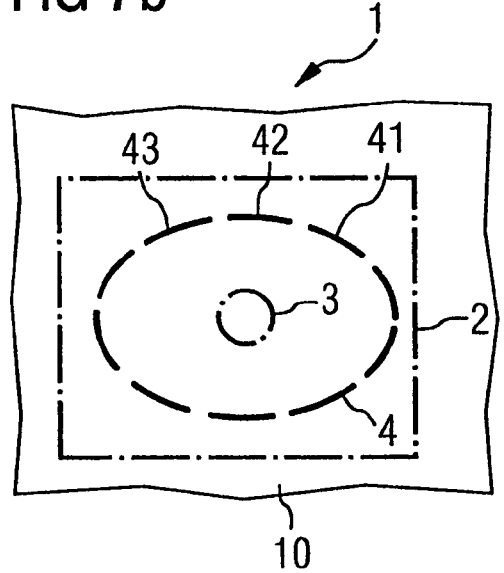
FIG. 7b shows an arrangement according to FIG. 7a in which the alignment pattern is formed by spaced-apart pattern features.

In relation to FIGS. 6a, 7a, ..., 14a, it is shown in corresponding FIGS. 6b, 7b, ..., 14b that the alignment pattern 4 may also be formed by spaced-apart pattern features 41, 42, 43, which are arranged along the periphery of said surface areas.

In the case of all the exemplary embodiments according to FIGS. 6a, 7a, ..., 14a, 6b, 7b, ..., 14b, the preferred bonding positions 3 are arranged within the respective surface area along the periphery of which the alignment pattern 4 extends.

FIG. 15 shows a further preferred exemplary embodiment of an alignment pattern. In the case of this arrangement, the alignment pattern 4 has portions 41, 42, 43, 44, which are respectively formed such that they are angled and extend in the corner region of a quadrilateral. Each of the pattern features 41, 42, 43, 44 has two elongate portions, which are at an angle of 90° in relation to each other.

The alignment patterns described on the basis of FIGS. 4, 5, 6a, 7a, ..., 14a, 6b, 7b, ..., 14b may be arranged not only between two metallization layers but also between an uppermost metallization layer and a semiconductor body, indirectly or directly on the semiconductor body.

The invention claimed is:

1. A method for producing a bonding connection of a semiconductor device, the method comprising:
   providing a semiconductor body, the semiconductor body having a surface, the surface comprising a surface portion on which a first metallization layer is arranged such that a section of the first metallization layer forms a surface of the semiconductor device, and an alignment pattern arranged between the surface portion and the first metallization layer, the alignment pattern causing local elevations in the first metallization layer above the surface portion,
   determining a position of the alignment pattern,
   determining a bonding position on the first metallization layer in the region of the surface portion on the basis of the determined position of the alignment pattern, and
   producing a bonding connection between the bonding partner and the first metallization layer at the bonding position.

2. The method as claimed in claim 1, wherein determining the position of the alignment pattern further comprises determining the position of local elevations of the first metallization layer that are arranged above the alignment pattern.

3. The method as claimed in claim 1, further comprising using an image recognition system to determine the position of the alignment pattern.

4. The method as claimed in claim 1, wherein the alignment pattern is formed of a dielectric material.

5. The method as claimed in claim 1, wherein providing the semiconductor body further comprises providing a second metallization layer arranged between the first metallization layer and the surface portion, and wherein the alignment pattern is formed from a patterned intermetal dielectric arranged between the first metallization layer and the second metallization layer.

6. The method as claimed in claim 1, wherein providing the semiconductor body further comprises providing a second metallization layer arranged between the first metallization layer and the surface portion, and wherein the alignment pattern is arranged between the surface portion and the second metallization layer.

7. The method as claimed in claim 1, wherein the alignment pattern is disposed directly on the surface portion.

8. The method as claimed in claim 1, wherein the alignment pattern is arranged along a line.

9. The method as claimed in claim 1, wherein the alignment pattern is arranged along an outline of a circle or an ellipse.

10. The method as claimed in claim 1, wherein the alignment pattern is arranged along the outline of a polygon.

11. The method as claimed in claim 1, wherein the alignment pattern has at least two spaced-apart pattern features.

* * * * *